United States Patent [19]
Lee

[11] Patent Number: 5,937,540
[45] Date of Patent: Aug. 17, 1999

[54] ELECTROTHERMAL DRYING DEVICE

[75] Inventor: Jun-Hsin Lee, Taipei Hsien, Taiwan

[73] Assignee: Asia Metal Industries, Inc., Taipei, Taiwan

[21] Appl. No.: 09/005,453

[22] Filed: Jan. 12, 1998

[51] Int. Cl.[6] .................................................. F26B 19/00
[52] U.S. Cl. .............................................. 34/267; 34/273
[58] Field of Search .............................. 34/266, 267, 268, 34/269, 273, 274, 543, 544, 547, 555, 580, 634; 219/370

[56] References Cited

U.S. PATENT DOCUMENTS

| | | | |
|---|---|---|---|
| 3,643,342 | 2/1972 | Tyson et al. | 34/555 |
| 4,665,626 | 5/1987 | Berkmann et al. | 34/267 |
| 4,882,852 | 11/1989 | Kautto | 34/273 |
| 5,261,166 | 11/1993 | Seeley et al. | 34/267 |

*Primary Examiner*—Henry Bennett
*Assistant Examiner*—Steve Gravini
*Attorney, Agent, or Firm*—Peterson, Wicks, Nemer & Kamrath, P.A.

[57] ABSTRACT

An electrothermal drying device has a hollow main body, a plurality of reflection hoods covering infrared electrothermal tubes, a plurality of air-inhaling blowers connected to the hollow main body, a plurality of waste vapor-exhaling blowers, a plurality of air separation devices, two air inlet stranglers, two pairs of high pressure gas valves connected to two high pressure gas tanks, a plurality of electric heaters disposed in the hollow main body, two emergency air-exhaling stranglers connected to the hollow main body, a plurality of heat-resistant glass panes located in the hollow main body and abutting the reflection hoods, two water atomizing devices located in the hollow main body and connected to two water tanks, and reflection hoods each having an is automatic rotating device.

2 Claims, 4 Drawing Sheets

ELECTROTHERMAL DRYING DEVICE

BACKGROUND OF THE INVENTION

The present invention relates to an electrothermal drying device. More particularly, the present invention relates to an electrothermal drying device which can dry an insulation sheet continuously after the insulation sheet is dipped in a polymer-impregnated resin solution.

An insulation sheet for a printed circuit board has one or more layers of carbon fiber fabric sheet or glass cloth sheet. The insulation sheet is dipped in a polymer-impregnated resin solution. The resin is a thermosetting resin such as an epoxy resin, a polyimide resin, a polyester resin, or a phenolic resin. After the insulation sheet is dipped in a polymer-impregnated resin solution, the insulation sheet is dried by a drying device. The function of the insulation sheet is to support a copper cladding in a printed circuit board. Referring to FIG. 1, a conventional drying device comprises a hollow main body 1 which has a drying chamber A, a plurality of hot air nozzles 2, and a plurality of air-inhaling channels 3, 3a. The hollow main body 1 is made of metal plates and heat-preserving plates. The conventional drying device can dry an insulation sheet after the insulation sheet is dipped in a polymer-impregnated resin solution 27 and carried by a plurality of rollers 26 to form a polymer-impregnated insulation sheet 4. The hot air passes through the hot air nozzle 2 to heat the polymer-impregnated insulation sheet 4 while the polymer-impregnated insulation sheet 4 is transported through the hollow main body 1. The solvent of the polymer-impregnated resin solution becomes vapors L which are exhaled by a blower. The hot air nozzle 2 has a large number of vent holes in order to stabilize the hot air. However, turbulent flow may occur so that the drying period in different drying sectional areas may vary. The dust may adhere to the surface of the polymer-impregnated insulation sheet 4. Furthermore, the hollow main body 1 is large and the air filtration effect is poor.

Referring to FIG. 2, another conventional drying device comprises a hollow main body 32 having a drying chamber H, a plurality of electrothermal radiation plates 33, a plurality of anti-knocking wires 34 connected to two controllers 35, and four hot air circulation devices 36. The drying device can dry an insulation sheet after the insulation sheet is dipped. in a polymer-impregnated resin solution 27 and carried by a plurality of rollers 26 to form a polymer-impregnated insulation sheet 4. The electrothermal radiation plates 33 can produce infrared radiation energy to heat the polymer-impregnated insulation sheet 4 while the polymer-impregnated insulation sheet 4 is transported through the hollow main body 32. The hot air O enters the hot air circulation system. The solvent of the polymer-impregnated resin solution becomes vapors P to be exhaled. When the polymer-impregnated insulation sheet 4 is broken in the hollow main body 32, the broken portion of the polymer-impregnated insulation sheet 4 may ignite on touching the electrothermal radiation plates 33. Therefore, it is very dangerous to use the conventional drying device.

SUMMARY OF THE INVENTION

An object of the present invention is to provide an electrothermal drying device which can dry an insulation sheet such as a carbon fiber fabric sheet or a glass cloth sheet continuously after the insulation sheet is dipped in a polymer-impregnated resin solution.

Accordingly, an electrothermal drying device comprises a hollow main body, a plurality of reflection hoods covering infrared electrothermal tubes, a plurality of air-inhaling blowers connected to the hollow main body, a plurality of waste vapor-exhaling blowers sending waste vapors from the hollow main body to a waste vapor incinerator, a plurality of air separation devices located on the hollow main body, two air inlet stranglers (air doors), two pairs of high pressure gas valves connected to two high pressure gas tanks, a plurality of electric heaters located in the hollow main body, two emergency air-exhaling stranglers connected to the hollow main body, a plurality of heat-resistant glass panes located in the hollow main body and abutting the reflection hoods, two water atomizing devices disposed in the hollow main body and connected to two water tanks, and reflection hoods each having an automatic rotating device to rotate the respective reflection hood ninety degrees when a power failure occurs.

DETAILED DESCRIPTION OF THE INVENTEON

Figure 1:
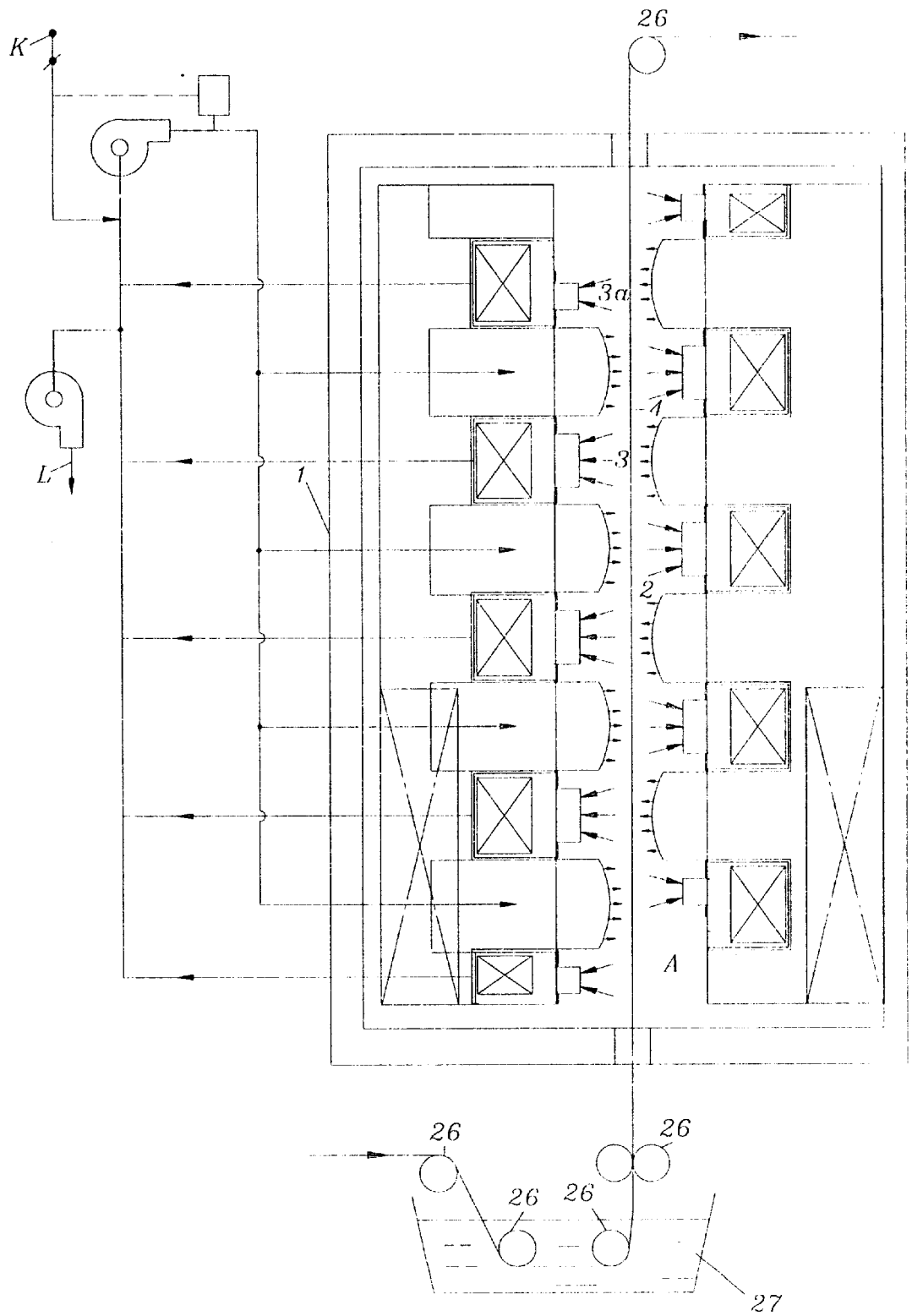
FIG. 1 is a schematic view of an electrothermal drying device of the prior art.
Figure 2:
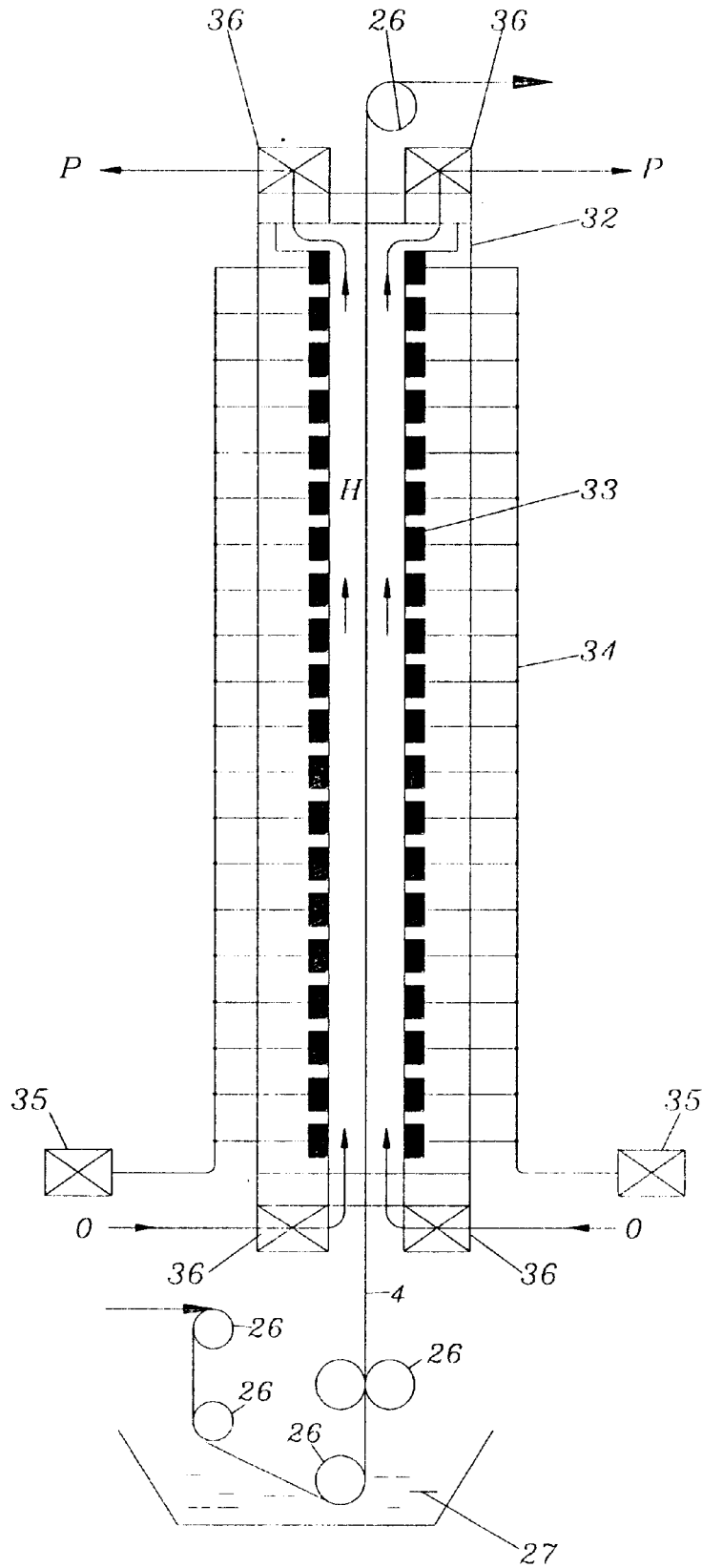
FIG. 2 is a schematic view of another electrothermal drying device of the prior art.
Figure 3:
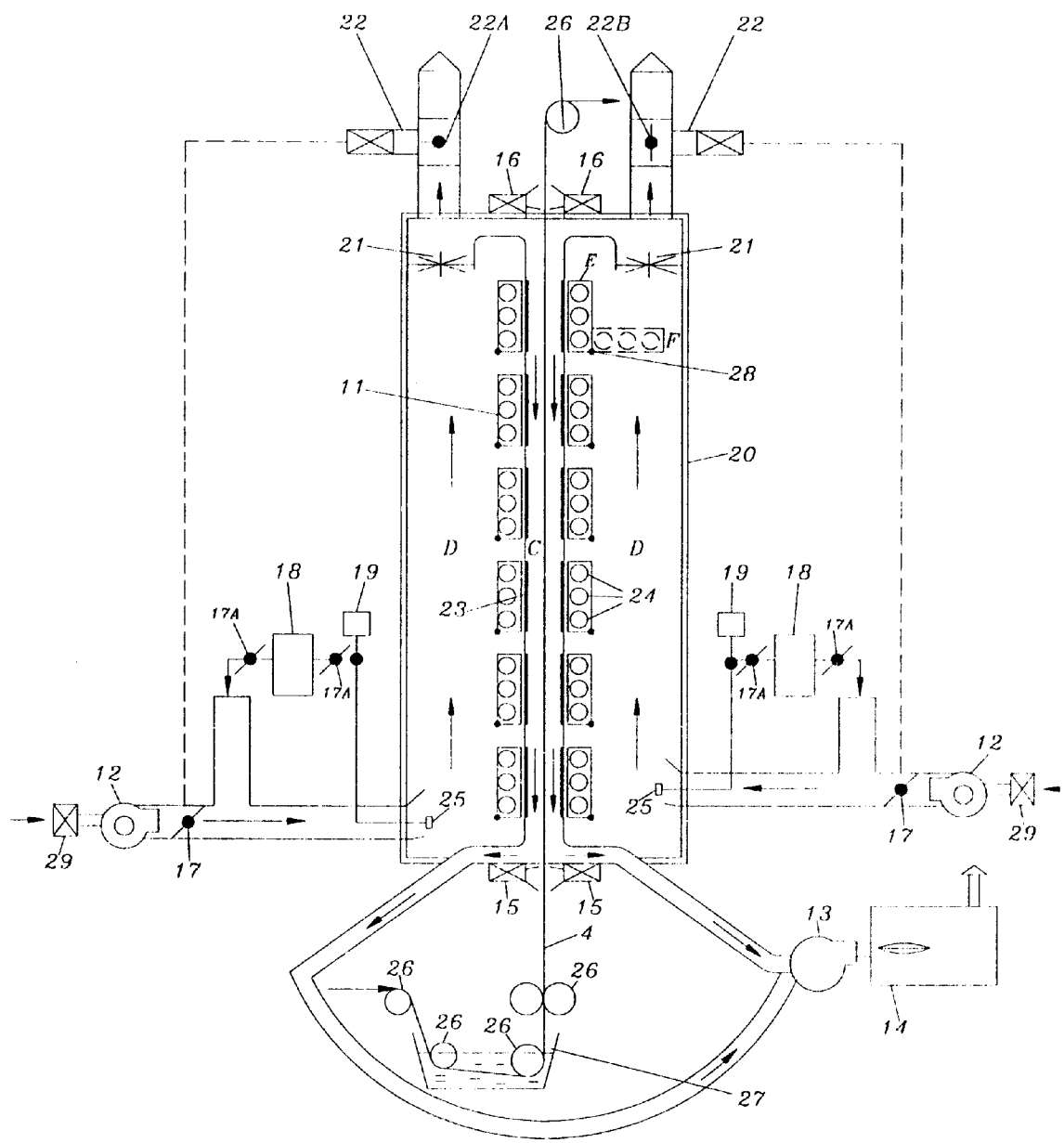
FIG. 3 is a schematic view of an electrothermal drying device of a preferred embodiment in accordance with the present invention.
Figure 4:
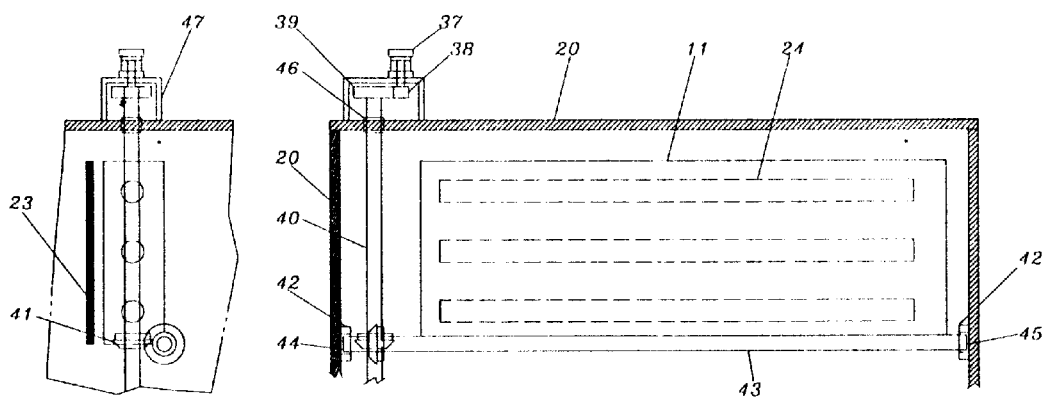
FIG. 4 is a schematic view illustrating a normal position of a reflection hood.
Figure 4A:
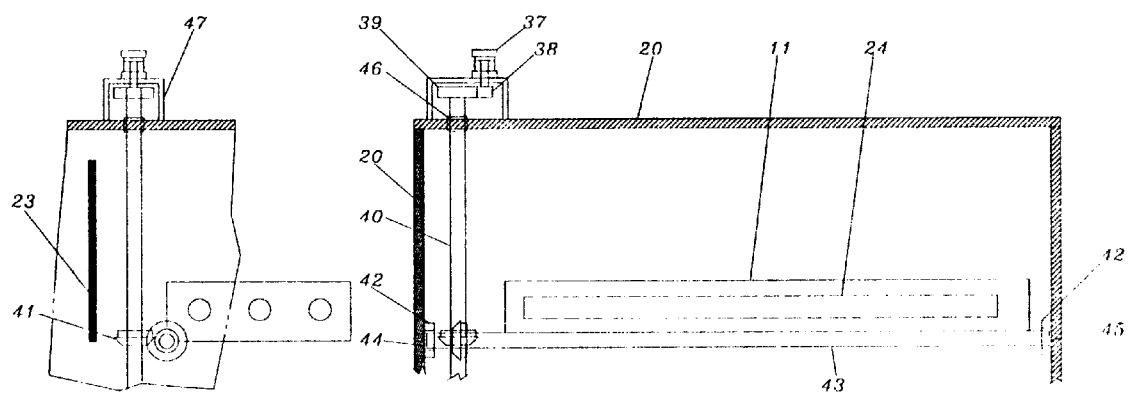
FIG. 4A is a schematic view illustrating the emergency position of a reflection hood.

Referring to FIGS. 3 to 4A, an electrothermal drying device comprises a hollow main body 20, a plurality of reflection hoods 11 covering infrared electrothermal tubes 24, a plurality of air-inhaling blowers 12 sending the air into the hollow main body 20, a plurality of waste vapor-exhaling blowers 13 sending waste vapors from the hollow main body 20 to a waste vapor incinerator 14, a plurality of air separation devices 15, 16 located on the hollow main body 20, two air inlet stranglers 17, two pairs of high pressure gas valves 17A connected to two high pressure gas tanks 18, a plurality of electric heaters 21 located in the hollow main body 20 to heat the air, two emergency air-exhaling stranglers 22 connected to the hollow main body 20, a plurality of heat-resistant glass panes 23 located in the hollow main body 20 and abutting the reflection hoods 11, two water atomizing devices 25 disposed in the hollow main body 20 and connected to two water tanks 19, and reflection hoods 11 each having an automatic rotating device 28 which can rotate the respective reflection hood 11 ninety degrees when a power failure occurs.

The automatic rotating device 28 is connected to a bevel gear wheel 41 which is connected to a transmission shaft 40. The transmission shaft 40 is connected to a gear 39. A shaft seal 46 encloses a portion of the transmission shaft 40. A pinion 38 which is connected to a motor 37 engages with the gear 39. The automatic rotating device 28 is supported by a positioning seat 42. A rotating shaft 43 is connected to the transmission shaft 40. Two spacings 44,45 are defined between the rotating shaft 43 and the hollow main body 20 for the expansion of the rotating shaft 43 which is made of steel.

The electrothermal drying device can dry an insulation sheet after the insulation sheet is dipped in a polymer-impregnated resin solution 27 and carried by a plurality of rollers 26 to form a polymer-impregnated insulation sheet 4. The hot air can heat the polymer-impregnated insulation sheet 4 while the polymer-impregnated insulation sheet 4 is transported through the hollow main body 20.

When a power failure occurs, the reflection hood 11 rotates until parallel with the polymer-impregnated insulation sheet 4. The emergency air-exhaling stranglers 22 rotate from the closed positions 22A to the open positions 22B. The hot vapor in the positive-pressure anti-knocking area D and in the solvent volatilization area C is exhaled from the hollow main body 20. The high pressure gas tanks 18 open the high pressure gas valves 17A to send the high pressure gas into the hollow main body 20. The water atomizing devices 25 send the atomized water to absorb residual heat in the reflection hoods 11, the infrared electrothermal tubes 24, and the electric heaters 21.

Further, the heat-resistant glass panes 23 separate the positive-pressure anti-knocking area D and the solvent volatilization area C. The pressure of the solvent volatilization area C is lower than the pressure of the positive-pressure anti-knocking area D. The fresh air will flow from the positive-pressure anti-knocking area D to the solvent volatilization area C. Thus the solvent will not enter the areas which contains wires.

The invention is not limited to the above embodiment but various modifications thereof may be made. Further, various changes in form and detail may be made without departing from the scope of the invention.

I claim:

1. An electrothermal drying device comprises:

a hollow main body, a plurality of reflection hoods covering infrared electrothermal tubes, a plurality of air-inhaling blowers connected to the hollow main body, a plurality of waste vapor-exhaling blowers sending waste vapors from the hollow main body to a waste vapor incinerator, a plurality of air separation devices located on the hollow main body, two air inlet stranglers connected to the hollow main body, two pairs of high pressure gas valves connected to two high pressure gas tanks, a plurality of electric heaters located in the hollow main body, two emergency air-exhaling stranglers connected to the hollow main body, a plurality of heat-resistant glass panes located in the hollow main body and abutting the reflection hoods, two water atomizing devices disposed in the hollow main body and connected to two water tanks, and reflection hoods each having an automatic rotating device to rotate the respective reflection hood ninety degrees when a power failure occurs.

2. An electrothermal drying device as claimed in claim 1, wherein the automatic rotating device is connected to a bevel gear wheel which is connected to a transmission shaft, the transmission shaft is connected to a gear, a shaft seal encloses a portion of the transmission shaft, a pinion is connected to a motor engaging with the gear, the automatic rotating device is supported by a positioning seat, and a rotating shaft is connected to the transmission shaft.

* * * * *